(12) United States Patent
Sugiura et al.

(10) Patent No.: US 6,373,674 B1
(45) Date of Patent: Apr. 16, 2002

(54) NOISE ELIMINATING APPARATUS OF HIGH-FREQUENCY TRANSMISSION SYSTEM

(75) Inventors: Toshihiro Sugiura; Masanari Hiramatsu; Hiroshi Matsubara, all of Nisshin (JP)

(73) Assignee: Masprodenkoh Kabushikikaisha, Nisshin (JP)

( * ) Notice: Subject to any disclaimer, the term of this patent is extended or adjusted under 35 U.S.C. 154(b) by 0 days.

(21) Appl. No.: 09/533,513

(22) Filed: Mar. 23, 2000

(30) Foreign Application Priority Data

Mar. 24, 1999 (JP) ............................. 11-079880
Mar. 30, 1999 (JP) ............................. 11-088858

(51) Int. Cl.$^7$ ................................. H02H 9/00
(52) U.S. Cl. ............................ 361/118; 333/17.1
(58) Field of Search .................... 361/51, 57, 58, 361/59, 66, 77, 79, 87, 93, 111, 118, 143, 146, 147, 159, 93.1, 93.5, 93.9; 333/17.1; 336/30, 70

(56) References Cited

U.S. PATENT DOCUMENTS 6,011,682 A * 1/2000 Storey ..................... 361/117
6,034,855 A * 3/2000 Bishop ..................... 361/58

* cited by examiner

*Primary Examiner*—Peter S. Wong
*Assistant Examiner*—Pia Tibbits
(74) *Attorney, Agent, or Firm*—Davis & Bujold, PLLC

(57) ABSTRACT

A primary winding of a first insulating transformer for balance-to-unbalance transformation is connected between the central electrode and the outer electrode of an input terminal, and windings of a noise eliminating transformer are provided within balanced lines on the side of a secondary winding of the first insulating transformer. A primary winding of a second insulating transformer for balance-to-unbalance transformation is connected between the central electrode and the outer electrode of an output terminal, and balanced lines on the side of the secondary winding of the second insulating transformer is connected to the noise eliminating transformer. One end of each of the primary windings, which is grounded to the ground line, is connected to the middle point of the secondary winding of each insulating transformer. Noise components having the same phase inputted from both electrodes of the input terminal are cancelled at the primary winding of the first insulating transformer, and the remaining noise components are completely eliminated through the noise eliminating transformer and the secondary winding of the second insulating transformer.

6 Claims, 12 Drawing Sheets

NOISE ELIMINATING APPARATUS OF HIGH-FREQUENCY TRANSMISSION SYSTEM

BACKGROUND OF THE INVENTION (i) Field of the Invention

The present invention relates to a noise eliminating apparatus of a high-frequency transmission system, in which high-frequency signals are transmitted through an unbalanced line comprising a coaxial cable, for eliminating noise entering the coaxial cable from the outside of and flowing through the unbalanced line.

(ii) Description of the Related Art

In a conventional high-frequency transmission system such as a CATV system in which high-frequency signals such as television broadcasting signals are transmitted through an unbalanced line comprising a coaxial cable, noise generated around the coaxial cable constituting a transmission line sometimes enters the outer conductor and, in some cases, even the central conductor of the coaxial cable, and is transmitted to a terminal device as common mode noise with the high-frequency signals to be transmitted.

When the transmission signals including such noise are transmitted directly to a subscriber terminal device, there arise a problem, for example, that proper reproduced signals (image signals, sound signals and the like) cannot be obtained at the subscriber terminal device even if the transmission signals from the system are received and demodulated.

Conventionally, therefore, the coaxial cable constituting the high-frequency transmission line from the center equipment of the high-frequency transmission system to the subscriber terminal device, namely, the trunk, the branch line branched from the trunk toward the subscriber's home, or the lead-in line to the subscriber's home connected to the branched line through a protector is inserted in a ferrite core for eliminating noise. As a result, noise components flowing through the outer conductor of the coaxial cable is eliminated.

Specifically, since an outside noise enters the mesh-like outer conductor constituting the coaxial cable and only the noise components surpassing the shielding value of the coaxial cable further enters the central conductor, i.e. the core wire of the coaxial cable, transmission of the noise toward the subscriber terminal device is supposed to be prevented by eliminating the noise components flowing through the outer conductor of the coaxial cable using the ferrite core.

However, the noise components induced in the central conductor of the coaxial cable cannot be eliminated, while the noise components flowing through the outer conductor of the coaxial cable can be eliminated by using the ferrite core. That is, the common mode noise cannot completely be eliminated.

SUMMARY OF THE INVENTION

Wherefore, an object of the present invention is to provide a noise eliminating apparatus capable of completely eliminating a common mode noise resulting from an outside noise entering a coaxial cable constituting the transmission line of a high-frequency transmission system such as a CATV system.

To achieve this and other objects, there is provided, according to one aspect of the present invention, a noise eliminating apparatus connected to a pair of coaxial cables for high-frequency transmission through respective connecting terminals, wherein a pair of balance-to-unbalance transformers for transforming unbalanced lines comprising coaxial cables into balanced lines are connected to the respective terminals, and wherein balanced lines connecting the pair of balance-to-unbalance transformers each other are provided with a noise eliminating transformer for canceling noise components flowing through a pair of lines constituting the balanced lines.

In the noise eliminating apparatus of the present invention, when noise is inputted from one connecting terminal through the coaxial cable, noise components in the outer conductor and noise components in the central conductor cancel each other through the winding of the unbalanced line of the balance-to-unbalance transformer provided on the side of the connecting terminal from which the noise is inputted, with the result that the noise components in the central conductor are eliminated.

The noise flowing through the coaxial cable include noise components in the outer conductor generated by induction of the outside noise into the outer conductor of the coaxial cable and noise components in the central conductor generated by induction of the noise components surpassing the shielding value of the coaxial cable. Since the signal level of the noise components in the central conductor is lower than that of the outer conductor, these noise components cancel each other at the balance-to-unbalance transformer and the noise components in the central conductor can be completely eliminated.

The remaining noise components unable to be eliminated by the balance-to-unbalance transformer flow through the inside balanced lines. However, a noise eliminating transformer provided on the balanced lines for canceling common mode noise components flowing through lines constituting the balanced lines completely eliminates common mode noise inputted from the connecting terminal.

According to another aspect of the present invention, the noise eliminating apparatus comprises: an insulating transformer having a primary winding connected to the central conductor and the outer conductor of a coaxial cable constituting a system side transmission line and a secondary winding connected to the central conductor and the outer conductor of a coaxial cable constituting a subscriber side transmission line; and a noise eliminating transformer having a pair of windings provided on the signal paths between both ends of one winding of the insulating transformer and the central conductor and the outer conductor of the coaxial cable connected to the both ends of the winding, the noise eliminating transformer eliminating common mode noise components flowing through the signal paths.

BRIEF DESCRIPTION OF THE DRAWINGS

Preferred embodiments according to the present invention will now be described with reference to the drawings, wherein.

DETAILED DESCRIPTION OF THE PREFERRED EMBODIMENT

First Embodiment

Figure 1:
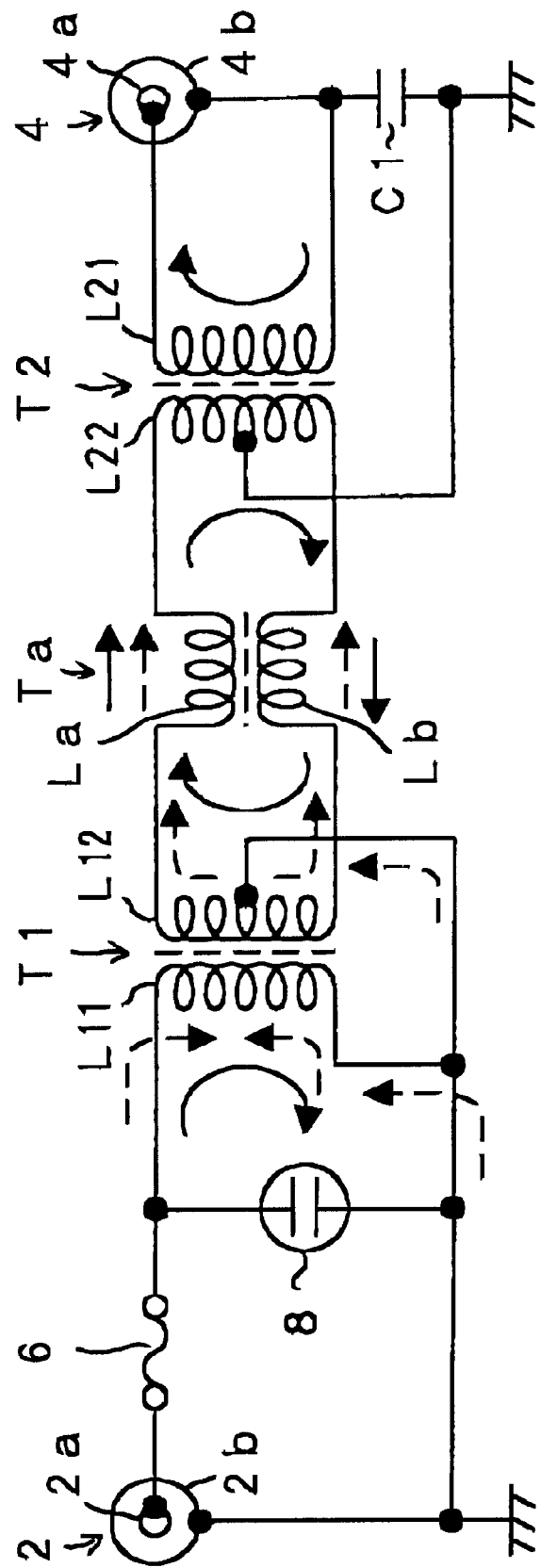
FIG. 1 is an electric circuit diagram showing the circuit constitution of a protector in a first embodiment of the present invention.

The protector according to a first embodiment of the present invention is disposed, for example, at the point where a transmission line is led in to a subscriber's home from a two-way CATV system in order to protect the subscriber terminal device from lightning or a short circuit by interrupting direct-current signals between the system side transmission line (or coaxial cable) and the subscriber side transmission line (or coaxial cable). As shown in FIG. 1, the protector is provided with a pair of connecting terminals, comprising an input terminal 2 to which the system side transmission line or coaxial cable is connected and an output terminal 4 to which the subscriber side transmission line or coaxial cable is connected.

One end of a primary winding L11 of an insulating transformer T1 is connected to a central electrode 2a in the input terminal 2, to which the central conductor of the coaxial cable is connected, through a fuse 6. The other end of the primary winding L11 is connected to the ground line having the same electric potential as an outer electrode 2b in the input terminal 2, to which the outer conductor of the coaxial cable is connected. An arrester 8 as a lightning protection element is connected in parallel to the primary winding L11.

Both ends of a secondary winding L12 of the insulating transformer T1 are connected to both ends of a secondary winding L22 of an insulating transformer T2, respectively, through windings La and Lb of a noise eliminating transformer Ta. One end of a primary winding L21 of the insulating transformer T2 is connected to the central electrode 4a of the output terminal 4, and the other end is connected to the outer electrode 4b of the output terminal 4.

The central conductor of the coaxial cable constituting the subscriber side transmission line is connected to the central electrode 4a of the output terminal 4, and the outer conductor of the coaxial cable is connected to the outer electrode 4b. The outer electrode 4b is connected to the ground line through a condenser C1 as interrupting means for interrupting direct-current signals or more specifically signal components having lower frequencies than those of the transmission signals. In other words, the outer electrode 4b is connected to the outer electrode 2b of the input terminal 2.

The insulating transformers T1 and T2 whose primary windings L11 and L21 are connected to the input terminal 2 and the output terminal 4, respectively, function as balance-to-unbalance transformers in the present invention. In the present embodiment, the turns ratios of the primary winding L11 to the secondary winding L12 and of the primary winding L21 to the secondary winding L22 are determined such that the impedances of the secondary windings L12 and L22 connected to each other through the noise eliminating transformer Ta are the same.

Specifically, in the case where the system side coaxial cable connected to the input terminal 2 and the subscriber side coaxial cable connected to the output terminal 4 have the same impedance (for example 75 Ω), the whole number of turns n2 of the secondary windings L12 and L22 is determined to be twice as large as the whole number of turns n1 of the primary windings L11 and L21 (n1:n2=1:2) such that the impedance of the balanced lines within the apparatus connected to the secondary windings L12 and L22 is four times (for example, 300 Ω) as large as the impedance of the unbalanced lines (coaxial cables) of the primary windings L11 and L21. Also, in the present embodiment, each line drawn from each middle point of the secondary windings L12 and L22 is connected to the ground line to which the primary windings L11 and L21 are grounded directly or through the condenser C1.

In the protector of the present embodiment described above, transmission signals (high-frequency signals to be transmitted) inputted through the input terminal 2 are provided with mode transformation by the insulating transformer T1 into transmission signals flowing through the inside balanced lines and further mode transformation by the insulating transformer T2 into transmission signals flowing through the unbalanced line, then are outputted toward the output terminal 4.

On the above transmission signal path, the input/output impedances of the insulating transformers T1 and T2 are symmetrical or the same. As a result, the return loss occurred by mode transformation is significantly reduced, and the transmission signals can be transmitted from the input terminal 2 to the output terminal 4 with an extremely small transmission loss of about 2 dB, for example.

On the other hand, the common mode noise transmitted through the system side coaxial cable have the same phase both in the outer conductor and in the central conductor of the coaxial cable, and inputted into the electrodes 2a and 2b of the input terminal in the same phase. Accordingly, the noise components inputted from the outer conductor and the central conductor of the coaxial cable cancel each other at the primary winding L11 of the insulating transformer T1 as indicated by a dotted-line arrow in FIG. 1.

The noise component flowing through the central conductor of the coaxial cable is induced within the central conductor by the surplus, over the shielding value of the coaxial cable, of the noise component which is induced in the outer conductor of the coaxial cable. Since the signal level of the noise component in the central conductor is lower than that in the outer conductor, the above described cancellation at the primary winding L11 of the insulating transformer results in elimination of the noise component in the central conductor. However, the noise component in the outer conductor remains to some extent and flows from the middle point of the secondary winding L12 of the insulating transformer T1 into the balanced lines connected to the both ends of the secondary winding L12.

Since the balanced lines are provided with windings La and Lb of the noise eliminating transformer Ta, through which the noise components unable to be eliminated at the primary winding L11 of the insulating transformer T1 flow in the same direction, the noise components cancel each other in the noise eliminating transformer Ta. Thus, the common mode noise inputted from the input terminal 2 is eliminated by the noise eliminating transformer Ta.

Even if the noise cannot completely be eliminated in the noise eliminating transformer, the noise components passing through the windings La and Lb of the noise eliminating transformer Ta flow into the secondary winding L22 of the insulating transformer T2, and cancel each other at the secondary winding L22 and are ultimately eliminated.

In the protector of the present embodiment, therefore, it is possible to completely eliminate the noise inputted from the input terminal 2 and prevent the noise from flowing into the subscriber terminal device from the output terminal 4.

Figure 2:
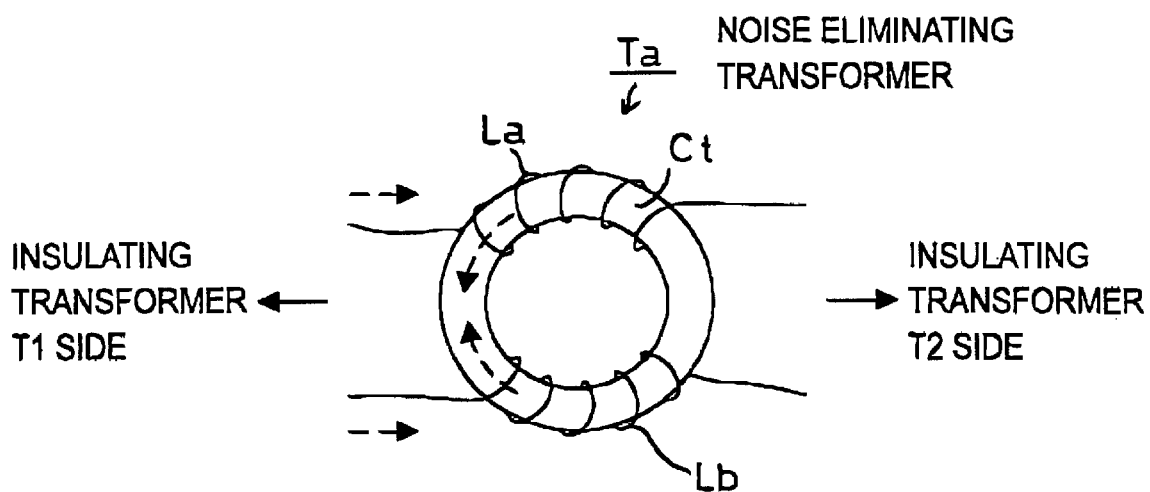
FIG. 2 is an explanatory view showing an example of the constitution of a noise eliminating transformer.

The noise eliminating transformer Ta, which is for eliminating common mode noise components flowing through the balanced lines, should be one in which windings La and Lb are wound around a core such that the magnetic fluxes generated by each noise component flowing through each of the windings La and Lb cancel each other. As shown in FIG. 2, the windings La and Lb may be wound in the reverse directions around a core Ct forming a closed magnetic circuit. In this case, the turns ratio of the windings La and Lb of the noise eliminating transformer is 1 to 1.

In the present embodiment, the insulating transformer T2 on the side of the output terminal 4 also is provided with a path for grounding from the middle point of the secondary winding L22 to the ground line in order to make the circuits on the sides of input terminal 2 and the output terminal 4 completely symmetrical. However, such a path is not always required, that is, the common mode noise inputted from the input terminal 2 can be eliminated without the path.

Figure 3:
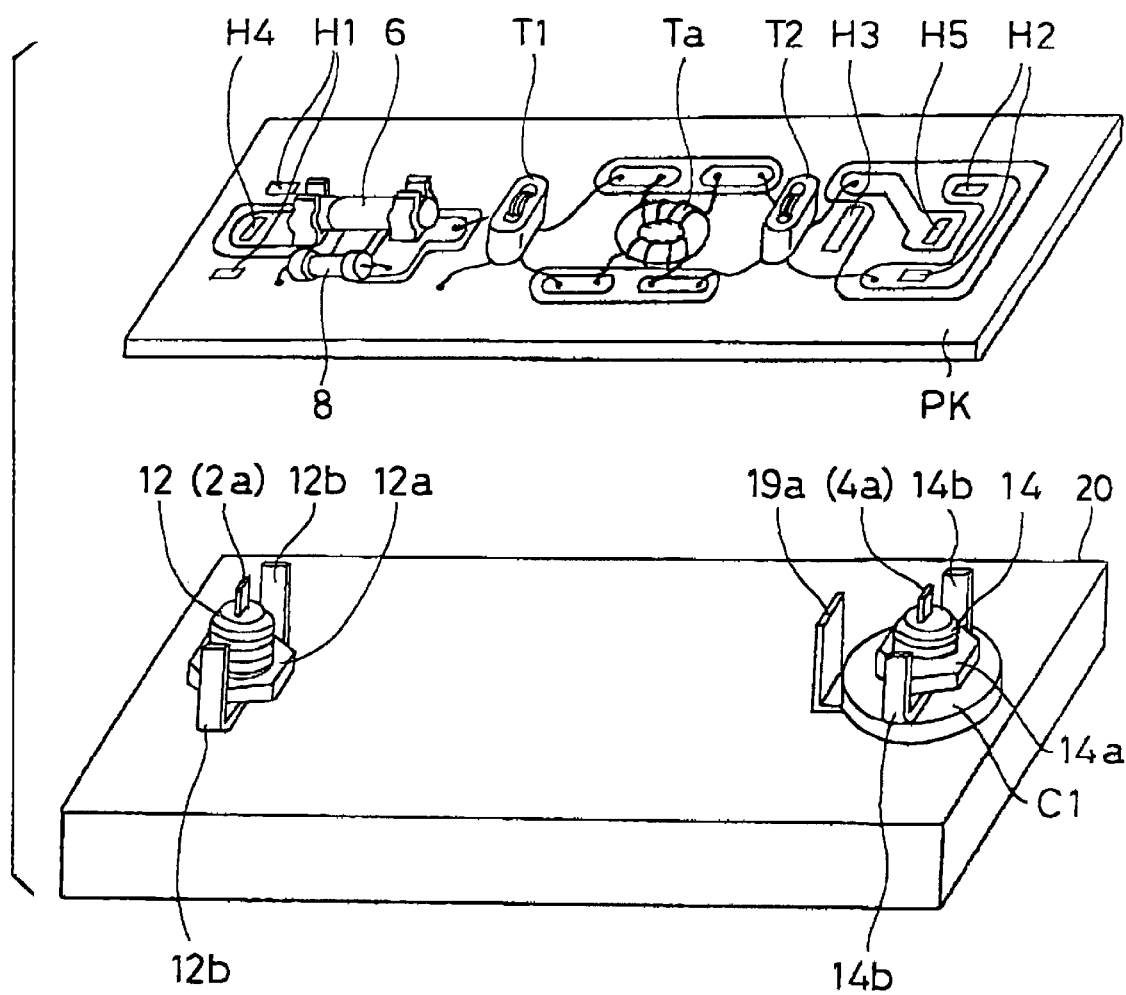
FIG. 3 is an exploded perspective view showing the structure of the protector in FIG. 1.
Figure 4:
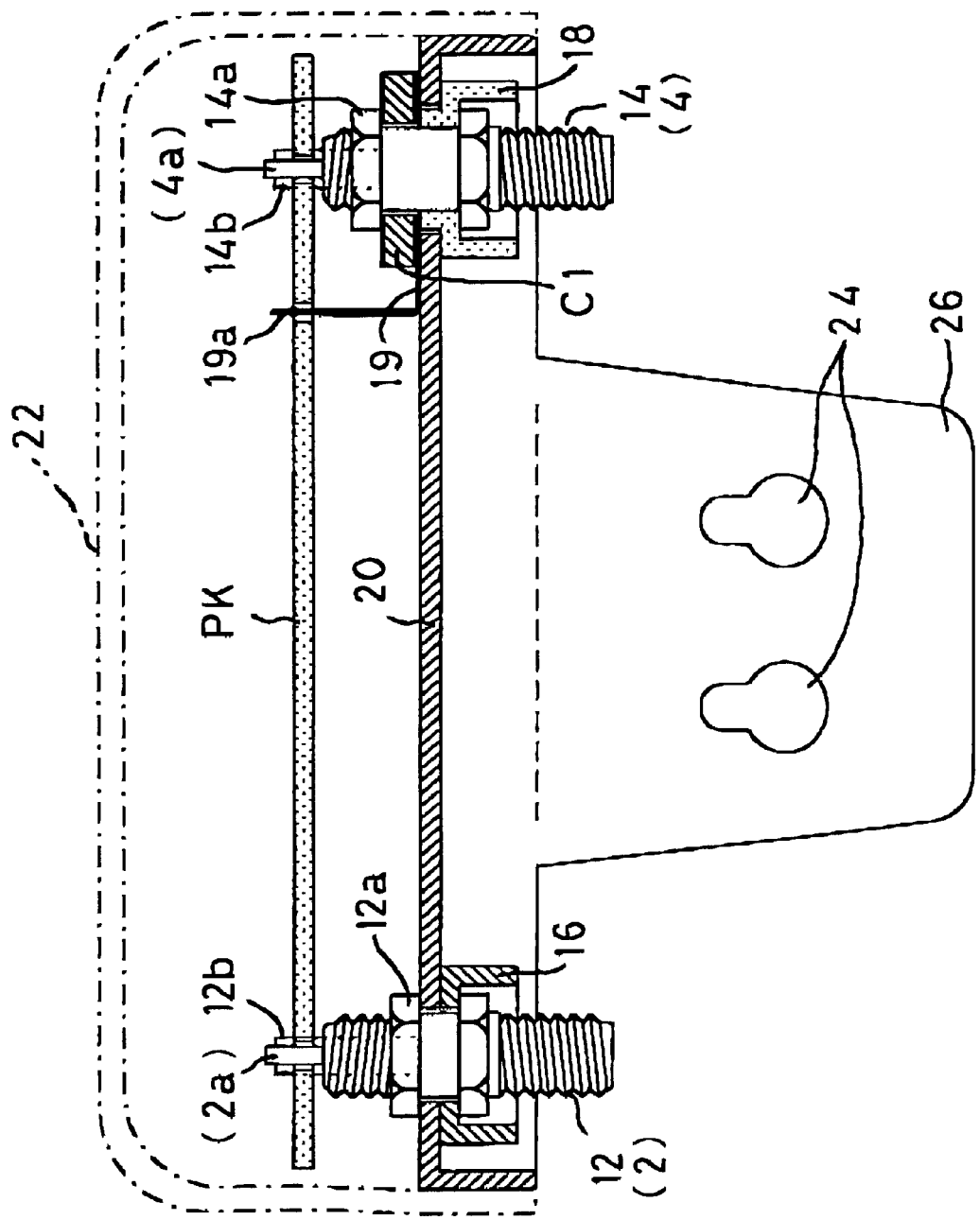
FIG. 4 is a cross-sectional view showing the structure of the protector in FIG. 1.

Referring to FIGS. 3 and 4, the structure of the protector according to the present embodiment will now be described.

As shown in FIG. 3, a fuse 6, an arrester 8, the insulating transformer T1, the noise eliminating transformer Ta, and an insulating transformer T2 are mounted on a printed board PK on which respective wiring patterns and respective grounding patterns therearound to be ground lines are formed. Plugs 12, 14 constituting the input terminal 2 and the output terminal 4 for connecting coaxial cables are fixed to a conductive chassis 20.

As shown in FIG. 4, the chassis 20 is designed to be covered with a shield cover 22 after fixing the printed board PK threreon in order to protect the circuit, and is provided with an attachment part 26 extending downward and having screw holes 24 for screwing the protector onto the outside wall, for example, of the subscriber's home.

To make the electric potential of the chassis 20 and the shield cover 22 fixed thereon the same as that of the outer conductor of the coaxial cable on the CATV system side, the plug 12 constituting the input terminal 2 is fixed to the chassis 20 through a metal (conductive) washer 16, and the plug 14 constituting the output terminal 4 is fixed to the chassis 20 through a resin (insulating) washer 18.

Between the chassis 20 and a nut 14a for fixing the plug 14 to the chassis 20 is provided a feedthrough capacitor constituting the above-described condenser C1 for interrupting direct-current signals and low-frequency signals. The condenser C1 carries out capacity coupling between the outer conductor of the plug 14, that is, the outer electrode 4b of the output terminal 4 and the chassis 20 as the ground line.

Between the chassis 20 or the feedthough condenser C1 and nuts 12a and 14a for fixing the plugs 12 and 14 to the chassis 20 are provided washers having electrodes 12b and 14b extending toward the upward printed board PK. Further, a washer 19 having an electrode 19a for grounding extending toward the upward printed board PK is fixed between the feedthrough condenser C1 and the chassis 20.

The printed board PK is provided with insertion holes H1, H2 and H3 for inserting the electrodes 12b, 14b and 19a, respectively, as well as insertion holes H4 and H5 for inserting the central conductors of the plugs 12 and 14, i.e. the central electrodes 2a and 4a of the input/output terminals 2 and 4, respectively. When the printed board PK is fixed to the chassis 20, the corresponding electrodes are inserted through the insertion holes H1 to H5 and soldered to the wiring patterns for mounting circuit elements or the grounding patterns formed on the surface of the printed board opposite to the chassis 20. The circuit shown in FIG. 1 is thus obtained.

As the foregoing, the protector of the present embodiment enables elimination of the noise inputted to the input terminal 2 from the system side transmission line of the two-way CATV system. Therefore, the noise is prevented from flowing into the subscriber terminal device through the protector and harmful influence of the noise on the subscriber terminal device is prevented.

Even if the noise generated by the radio waves from shortwave broadcasting stations and radio sets of, for example, illegal CB (citizens' band) which affect upward signals in a bandwidth of 5 MHz to 42 MHz used for transmitting a variety of data from the subscriber terminal device to the center equipment flow into the protector, such noise can be eliminated and therefore the data transmission from the subscriber terminal device to the center equipment can be performed properly.

In addition, according to the present embodiment, the function as a protector can be achieved with a simple structure as well as surge suppression effect can be improved because it is possible to completely interrupt direct-current signals between the system side transmission line and the subscriber side transmission line with the insulating transformers T1 and T2 and the condenser C1. Since the protector in the present embodiment is provided with the fuse 6 to blow out by overcurrent and the arrester 8 as a lightning protection element on the input terminal 2 side, the reliability as a protector is enhanced.

Although one embodiment of the invention has been described, the invention is not restricted to the embodiment and may be embodied in various forms.

For example, in the embodiment wherein the transformers T1 and T2 are provided as balance-to-unbalance transformers on both sides of the input terminal 2 and output terminal 4, the turns ratio n1:n2 of the primary windings L11 and L21 on the sides of the terminals 2 and 4, i.e. on the unbalanced lines, to the secondary windings L12 and L22 of the balanced lines inside the apparatus is 1:2. However, the ratios are to be determined in accordance with the impedance of the unbalanced lines on the sides of the input/output terminals 2 and 4 such that the impedance of the balanced lines are the same in the transformers T1 and T2. When the impedance of the system side unbalanced line or the coaxial cable connected to the input terminal 2 is 50 Ω and the impedance of the subscriber side unbalanced line or the coaxial cable connected to the output terminal 4 is 75 Ω, each turns ratio of the primary winding and the secondary winding in each transformer is to be determined such that the impedances of the secondary windings are the same.

Further, the insulating transformers T1 and T2 used as balance-to-unbalance transformers connected to the input terminal 2 and output terminal 4 may be replaced by balun transformers which have been used as a matching transformer for performing impedance transformation and mode transformation between a coaxial cable (for example 75 Ω, unbalanced) and a parallel feeder (300 Ω, balanced).

Figure 5:
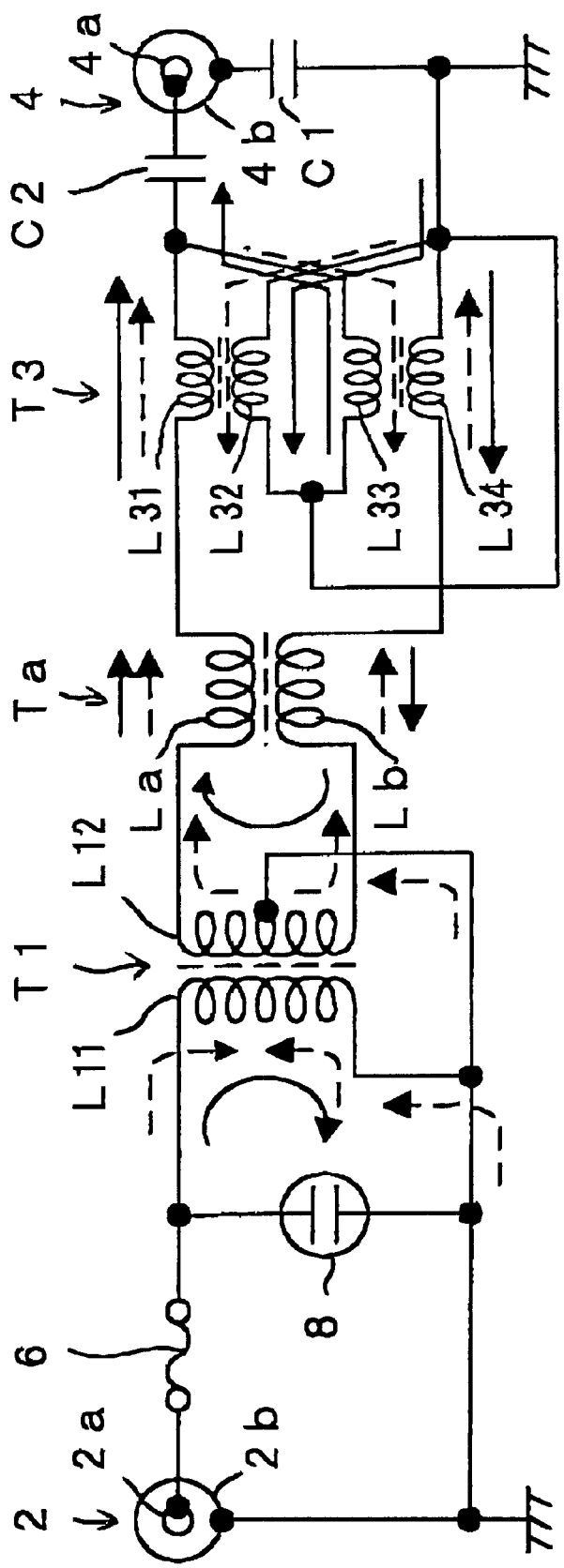
FIG. 5 is an electric circuit diagram showing the circuit constitution of a modification of the protector in the first embodiment.

FIG. 5 shows the constitution of a protector provided with a balun transformer T3 including four coils L31, L32, L33 and L34 having the same turns of windings around the same ferrite cores, instead of the insulating transformer T2 on the side of the output terminal 4. Also in such a case where the balun transformer T3 is used as a balance-to-unbalance transformer, high-frequency signals to be transmitted are transmitted, as indicated by the solid lines in FIG. 5, toward the output terminal 4 with little transmission loss, and the noise components passing through the noise eliminating transformer Ta are cancelled between the windings as indicated by the dotted lines in FIG. 5. Thus, the similar operation as in the above embodiment can be achieved.

When the balun transformer T3 is used as the balance-to-unbalance transformer to be provided on the side of the output terminal 4, there exists a path allowing passage of direct-current signals which comprises the winding L31 of the balun transformer T3, the winding La of the noise eliminating transformer Ta, the primary winding L12 and its middle point of the insulating transformer. Therefore, to achieve the function as a protector, it is necessary to provide another condenser C2 as direct-current signal interrupting means like the condenser C1 between the central electrode 4a of the output terminal 4 and the winding L31 of the balun transformer T3 as shown in FIG. 5.

A balun transformer like the above can cancel common mode signal components inputted from the unbalanced line in the same way as the insulating transformer of the embodiment. Therefore, one balun transformer may be provided on the side of the input terminal 2 or two balun transformers may be connected to both the input and output terminals, respectively.

Although an application of the noise eliminating apparatus of the present invention to a protector is described in the present embodiment, the noise eliminating apparatus can eliminate noise flowing through the transmission line wherever it may be disposed on the transmission path in any system, such as a CATV system, in which high-frequency signals are transmitted using a coaxial cable (i.e. unbalanced line). Therefore, the noise eliminating apparatus according to the present invention may be constituted as a separate structure and disposed on a desired transmission line, or may be incorporated in an amplifier for amplifying high-frequency signals or a tap device for distributing high-frequency signals disposed on the transmission line.

However, when an insulating transformer is used as the balance-to-unbalance transformer, it is impossible to pass direct-current signals (more specifically direct-current signals and signal components having frequencies lower than those of transmission signals) between the input and output terminals. Therefore, in a system where electric power is supplied through the transmission line to the amplifier or the like disposed on the transmission line, it is necessary to provide another power supply line when the noise eliminating apparatus of the present invention is disposed on the transmission line.

When a balun transformer is used as the balance-to-unbalance transformer, power supply signals can be passed through the winding of the balun transformer. In this case, however, the coil of the balun transformer may generate heat and sometimes break when the supplied power is great. Therefore, in a system where electric power is supplied through the transmission line to the amplifier or the like disposed on the transmission line, it is preferable to provide another power supply line when the noise eliminating apparatus of the present invention is disposed on the transmission line.

Figure 6:
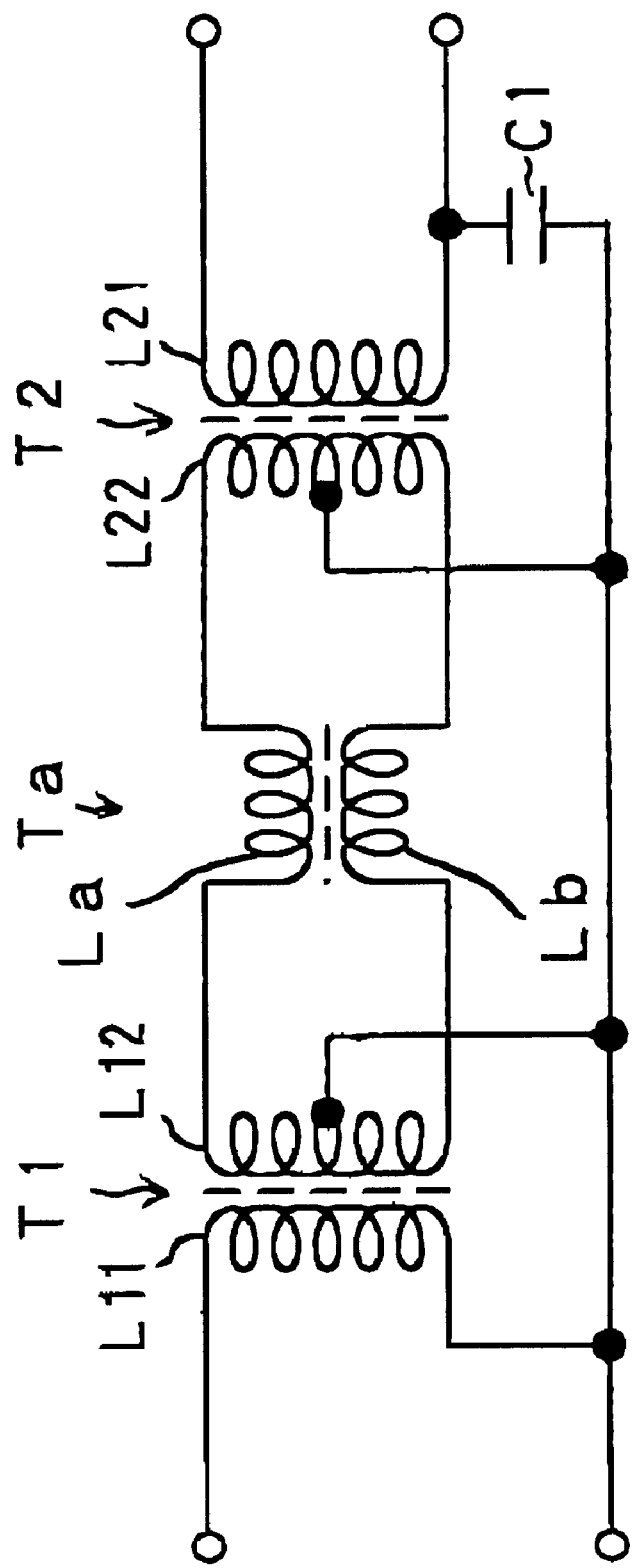
FIG. 6 is an electric circuit diagram showing the constitution of a noise eliminating circuit related to the protector in FIG. 1.
Figure 7:
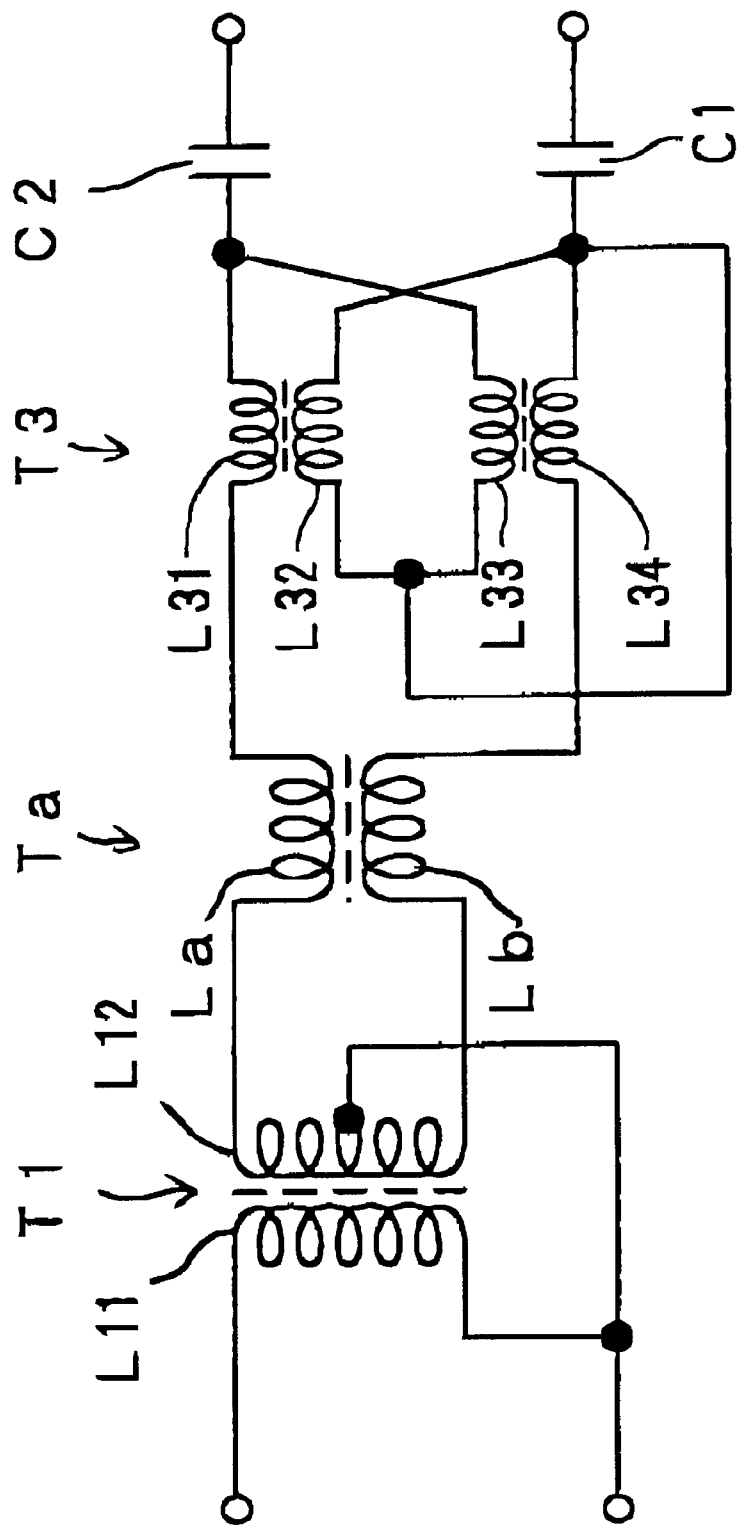
FIG. 7 is an electric circuit diagram showing the constitution of a noise eliminating circuit related to the protector in FIG. 5.

The fuse 6 and the arrester 8 shown in FIGS. 1 and 5 are not necessary to merely eliminate noise. Shown in FIGS. 6 and 7 is a protector, i.e. a noise eliminating circuit, without the fuse 6 and the arrester 8. Since the protector is the same as the protector in FIGS. 1 and 5 except that it does not comprise the fuse 6 and the arrester 8, the same components given the same reference symbols are not explained in particular.

Second Embodiment

Figure 8:
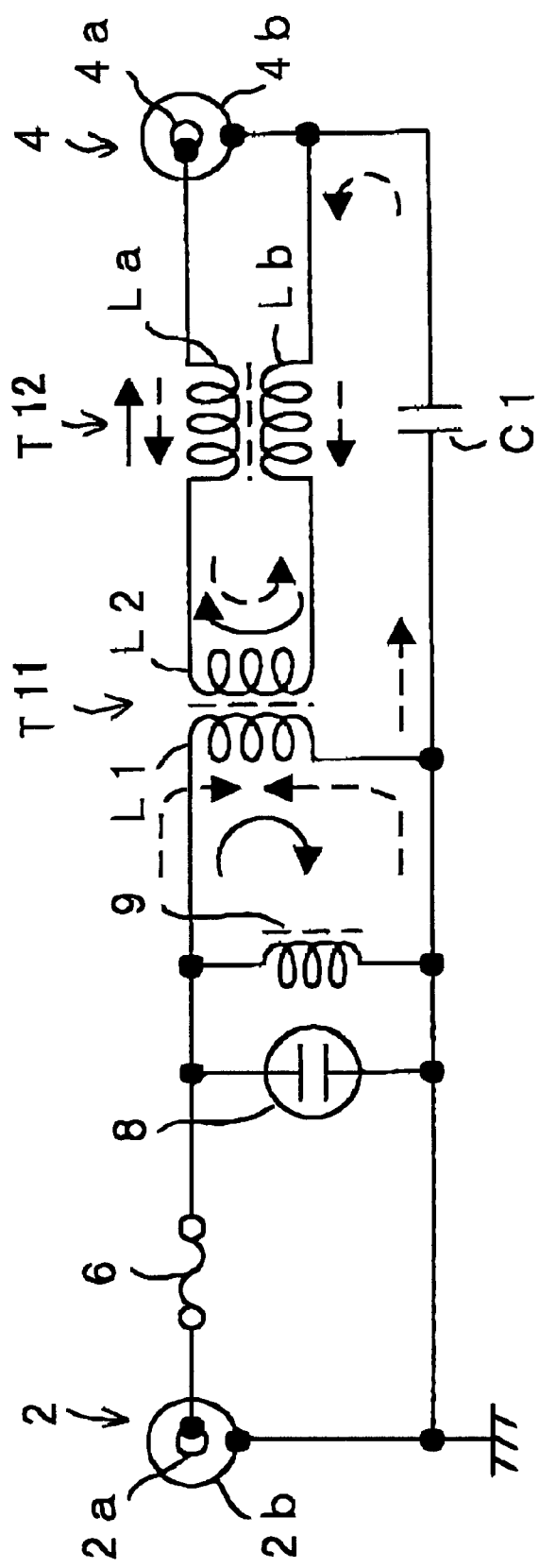
FIG. 8 is an electric circuit diagram showing the circuit constitution of a protector in a second embodiment of the present invention.

FIG. 8 is an electric circuit diagram showing the constitution of a protector in a second embodiment according to the present invention.

The same as in the first embodiment, the protector is disposed, for example, at the point where a transmission line is led in to a subscriber's home from a two-way CATV system in order to protect the subscriber terminal device from lightning or a short circuit by interrupting direct-current signals between the system side transmission line (or coaxial cable) and the subscriber side transmission line (or coaxial cable). As shown in FIG. 8, the protector is provided with an input terminal 2 to which the system side transmission line or coaxial cable is connected, and an output terminal 4 to which the subscriber transmission terminal or coaxial cable is connected One end of a primary winding L1 of an insulating transformer T11 is connected to a central electrode 2a in the input terminal 2, to which the central conductor of the coaxial cable is connected, through a fuse 6. The other end of the primary winding L1 is connected to the ground line having the same electric potential as an outer electrode 2b in the input terminal 2, to which the outer conductor of the coaxial cable is connected. An arrester 8 and a choke coil 9 as lightning protection elements are connected in parallel to the primary winding L1.

One end of a secondary winding L2 of the insulating transformer T11 is connected to the central electrode 4a of the output terminal 4 through one winding La of a noise eliminating transformer T12 and the other end of the secondary winding L2 is connected to the outer electrode 4b of the output terminal 4 through the other winding Lb of the noise eliminating transformer T12. The central conductor of the coaxial cable constituting the subscriber side transmission line is connected to the central electrode 4a of the output terminal 4, and the outer conductor of the coaxial cable is connected to the outer electrode 4b. The outer electrode 4b is connected to the outer electrode 2b of the input terminal 2 as well as the ground line through a condenser C1 for interrupting direct-current signals and low-frequency signals.

In the protector of the present embodiment described above, transmission signals inputted through the input terminal 2 flow through the primary winding L1 of the insulating transformer T11, and induced transmission signals in the secondary winding L2 are outputted therefrom toward the output terminal 4.

While the common mode noise component inputted from the outer conductor of the system side coaxial cable through the outer electrode 2b of the input terminal 2 flows through the ground line toward the primary winding L1 of the insulating transformer T11 as indicated by the dotted-line arrow in FIG. 8, the normal mode noise component inputted from the central conductor of the system side coaxial cable toward the outer electrode 2b of the input terminal 2 flows through the primary winding L1 of the insulating transformer T11 in the opposite direction to the above common mode noise component. Thus, the normal mode noise component and common mode noise component cancel each other in the primary winding L1.

The normal mode noise component, which is induced in the central conductor of the coaxial cable by the surplus, over the shielding value of the coaxial cable, of the common mode noise component induced in the outer conductor cannot completely be eliminated in the primary winding L1 of the insulating transformer T11. When the remaining common mode noise component flows through the primary winding L1 of the insulating transformer T11, a voltage corresponding to the common mode noise component is induced in a secondary winding L2 and the electric current corresponding to the common mode noise component flows in the opposite direction to the normal transmission signals.

However, a part of (approximately half of) the remaining common mode noise component which has not been eliminated in the primary winding L1 of the insulating transformer T11 flows through a condenser C1 for interrupting direct-current signals and low frequency signals into the secondary winding L2 of the insulating transformer T11. In this case, the common mode noise component flows in the opposite direction to the common mode noise component induced in the secondary winding L2 from the primary winding L1 of the insulating transformer T11. Therefore, these common mode noise components are cancelled to completely disappear with the noise eliminating transformer T12 and the secondary winding L2 of the insulating transformer T11.

The noise eliminating transformer T12, which is for eliminating common mode noise components flowing through the signal paths connecting the both ends of the secondary winding L2 with the central electrode 4a and the outer electrode 4b of the output terminal 4, respectively, should be one in which windings La and Lb are wound around a core such that the magnetic fluxes generated by each noise component flowing through each of the windings La and Lb cancel each other. For example, as shown in FIG. 2, each of windings La and Lb may be wound in the reverse directions around a core Ct forming a closed magnetic circuit.

In this case, each turns ratio of the windings L1 and L2 of the insulating transformer T11 and the windings La and Lb of the noise eliminating transformer may be basically 1 to 1. However, it is extremely difficult to manufacture an ideal transformer having the input/output impedance of a ratio of 1 to 1, while using the insulating transformer T11 having a turns ratio of 1 to 1. Accordingly, in the present embodiment, the turns ratio of the insulating transformer T11 is fixed unevenly at 1 to 0.7, for example, and by adjusting the turns ratio of the noise eliminating transformer T12, the input/output impedances are made equal to the impedance of the coaxial cable to be connected to the input/output terminals 2 and 4, which is normally 75 Ω or 50 Ω.

The structure of the protector in the present embodiment will now be described with reference to the perspective view of FIG. 9.

Figure 9:
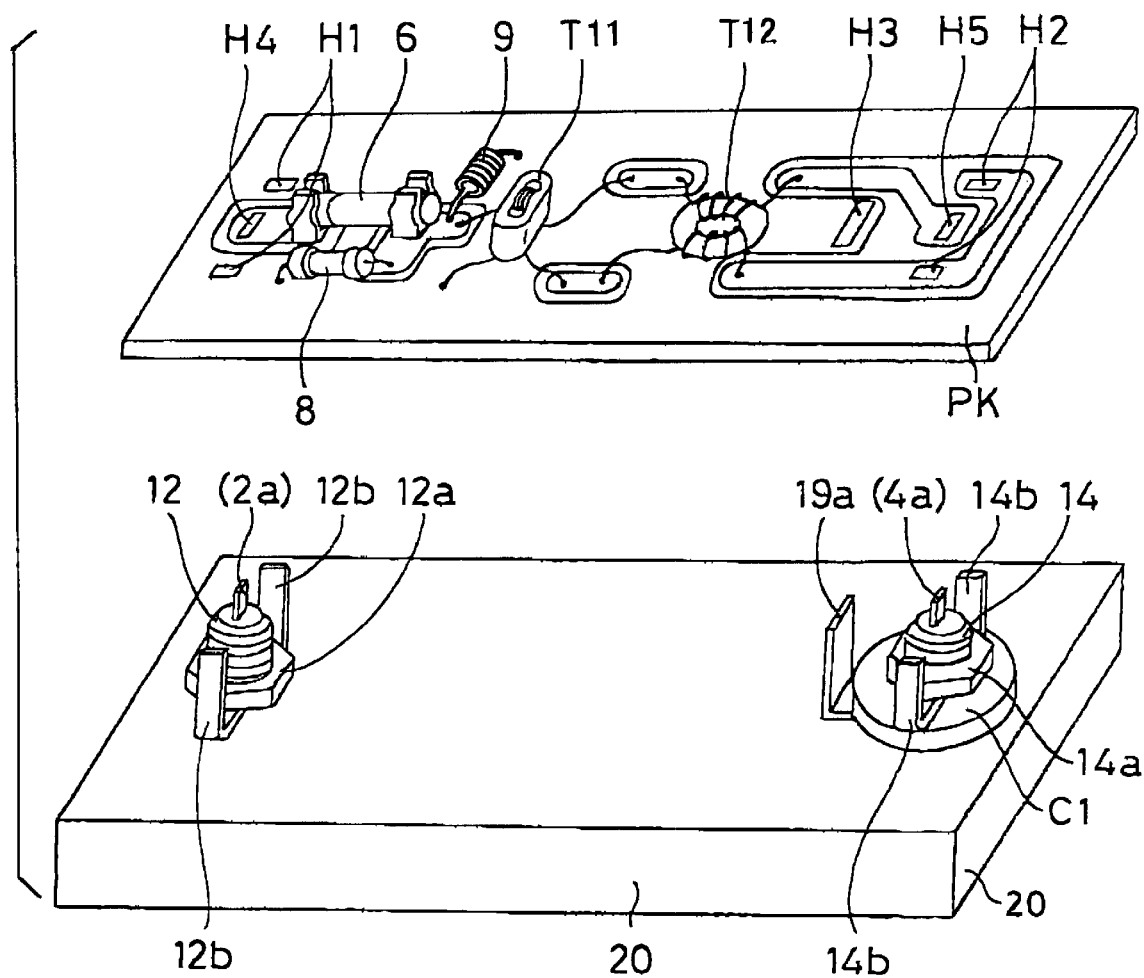
FIG. 9 is an exploded perspective view showing the structure of the protector in FIG. 8.

As shown in FIG. 9, a fuse 6, an arrester 8, a choke coil 9, the insulating transformer T11 and the noise eliminating transformer T12, are mounted on a printed board PK on which respective wiring patterns and respective grounding patterns therearound to be ground lines are formed. Plugs 12, 14 constituting the input terminal 2 and the output terminal 4 for connecting coaxial cables are fixed to a conductive chassis 20.

The same as in the first embodiment shown in FIG. 4, the chassis 20 is designed to be covered with a shield cover 22 after fixing the printed board PK threreon in order to protect the circuit, and is provided with an attachment part 26 extending downward and having screw holes 24 for screwing the protector onto the outside wall, for example, of the subscriber's home.

To make the electric potential of the chassis 20 and the shield cover 22 fixed thereon the same as that of the outer conductor of the coaxial cable on the CATV system side, the plug 12 constituting the input terminal 2 is fixed to the chassis 20 through a metal (conductive) washer 16, and the plug 14 constituting the output terminal 4 is fixed to the chassis 20 through a resin (insulating) washer 18.

Between the chassis 20 and a nut 14a for fixing the plug 14 to the chassis 20 is provided a feedthrough capacitor constituting the above-described condenser C1 for interrupting direct-current signals and low frequency signals. The condenser C1 carries out capacity coupling between the outer conductor of the plug 14, that is, the outer electrode 4b of the output terminal 4 and the chassis 20 as the ground line.

Between the chassis 20 or the feedthough condenser C1 and nuts 12a and 14a for fixing the plugs 12 and 14 to the chassis 20 are provided washers having electrodes 12b and 14b extending toward the upward printed board PK. Further, a washer 19 having an electrode 19a for grounding extending toward the upward printed board PK is fixed between the feedthrough condenser C1 and the chassis 20.

The printed board PK is provided with insertion holes H1, H2 and H3 for inserting the electrodes 12b, 14b and 19a, respectively, as well as insertion holes H4 and H5 for inserting the central conductors of the plugs 12 and 14, i.e. the central electrodes 2a and 4a of the input/output terminals 2 and 4, respectively. When the printed board PK is fixed to the chassis 20, the corresponding electrodes are inserted through the insertion holes H1 to H5 and soldered to the wiring patterns for mounting circuit elements or the grounding patterns formed on the surface of the printed board opposite to the chassis 20. The circuit shown in FIG. 8 is thus obtained.

As the foregoing, the protector of the present embodiment enables elimination of both the normal mode noise component and the common mode noise component inputted to the input terminal 2 from the system side transmission line of the two-way CATV system. Therefore, the noise is prevented from flowing into the subscriber terminal device through the protector and harmful influence of the noise on the subscriber terminal device is prevented.

Even if the noise generated by the radio waves from shortwave broadcasting stations and radio sets of, for example, illegal CB (citizens' band) which affect upward signals in a bandwidth of 5 MHz to 42 MHz used for transmitting a variety of data from the subscriber terminal device to the center equipment flow into the protector, such noise can be eliminated and therefore the data transmission from the subscriber terminal device to the center equipment can be performed properly.

In addition, according to the present embodiment, the function as a protector can be achieved with a simple structure as well as surge suppression effect can be improved because it is possible to completely interrupt direct-current signals between the system side transmission line and the subscriber side transmission line with the insulating transformer T11 and the condenser C1. Since the protector in the present embodiment is provided with the fuse 6 to blow out by overcurrent and the arrester 8 and the choke coil 9 as lightning protection elements on the side of the input terminal 2, the reliability as a protector is enhanced.

If the noise eliminating transformer T12, which is disposed on the side of the secondary winding L2 of the insulating transformer T11 in the embodiment, is disposed on the side of the primary winding L1 of the insulating transformer T11, it is possible to obtain approximately the same operation as in the embodiment.

Figure 10:
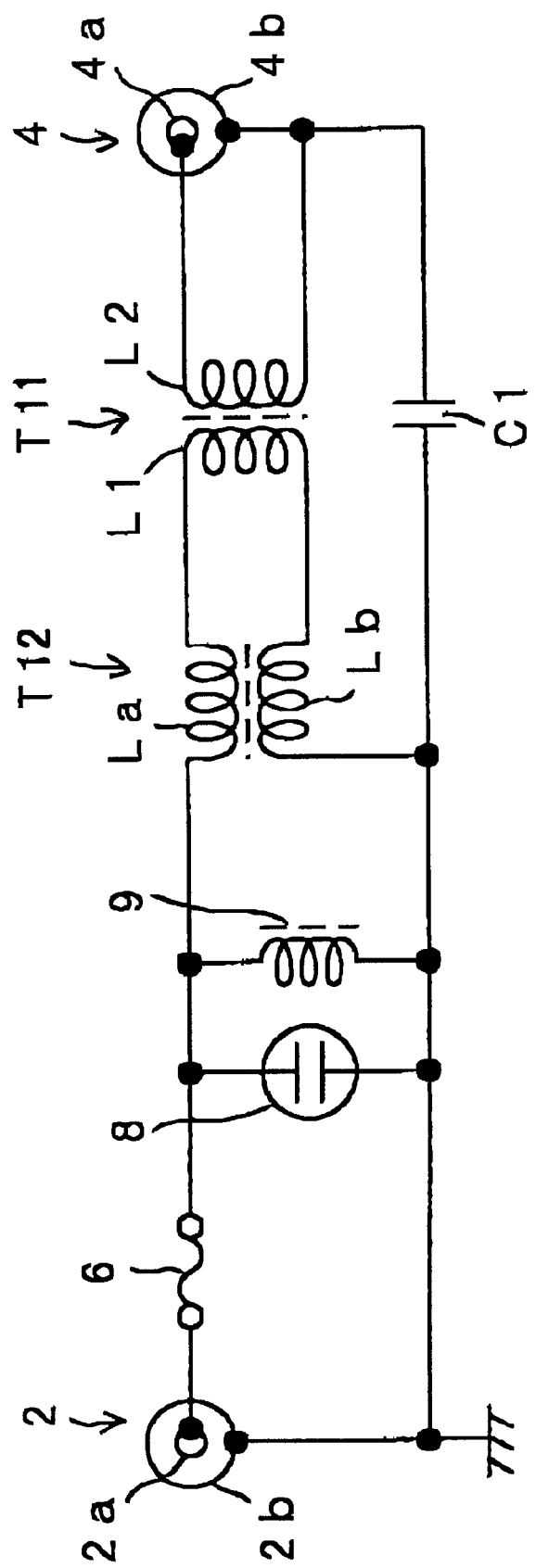
FIG. 10 is an electric circuit diagram showing the circuit constitution of a modification of the protector in the second embodiment.
Figure 11:
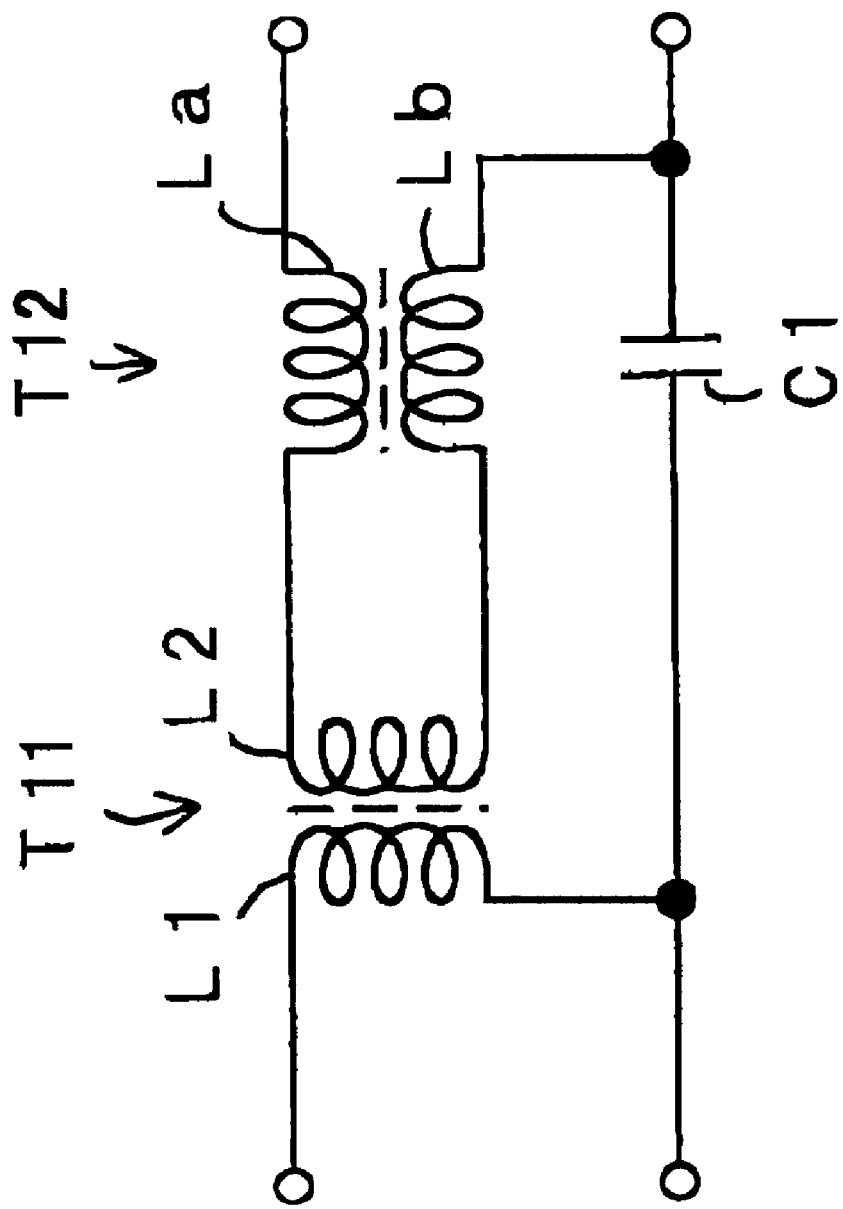
FIG. 11 is an electric circuit diagram showing the constitution of a noise eliminating circuit related to the protector in FIG. 8.
Figure 12:
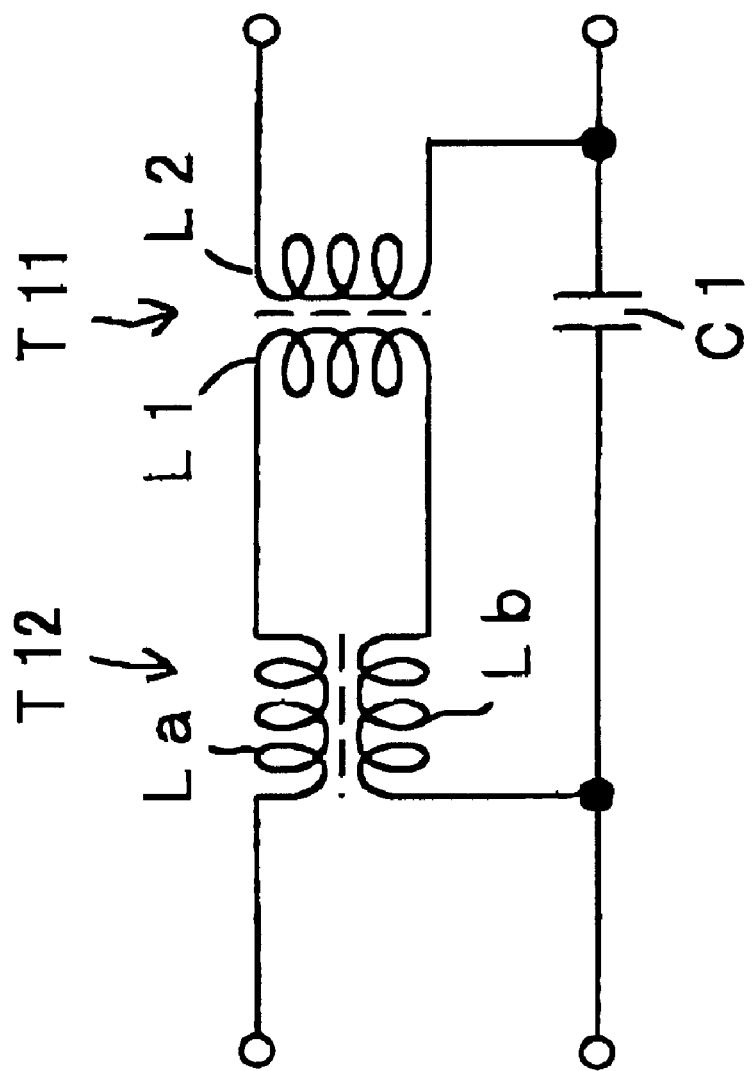
FIG. 12 is an electric circuit diagram showing the constitution of a noise eliminating circuit related to the protector in FIG. 10.

The fuse 6, the arrester 8 and the choke coil 9 shown in FIGS. 8 and 10 are not necessary to merely eliminate noise. Shown in FIGS. 11 and 12 is a protector, or a noise eliminating circuit without the fuse 6, the arrester 8, and the choke coil 9. Since the protector is the same as the protector in FIGS. 8 and 10 except that it does not comprise the fuse 6, the arrester 8 and the choke coil 9, the same components given the same reference symbols are not explained in particular.

What is claimed is:

1. A noise eliminating apparatus connected between the system side transmission line of a high-frequency transmission system for transmitting high-frequency signals and a subscriber side transmission line to eliminate noise entering from the outside, the noise eliminating apparatus comprising:

a set of system side terminals connected to said system side transmission line;

a set of subscriber side terminals connected to said subscriber side transmission line;

an insulating transformer having a primary winding connected to said set of system side terminals and a secondary winding connected to said set of subscriber side terminals; and a noise eliminating transformer having a first and a second windings provided on signal paths, respectively, between both ends of one winding of said insulating transformer and one of said sets of system side terminals and subscriber side terminals connected to said both ends of the winding, wherein one end of the first winding and one end of the second winding are connected to the both ends of said one winding of said insulating transformer, and wherein the other end of the first winding and the other end of the second winding are connected to said one of said sets of terminals, and noise components having the same phase and flowing through said signal paths are eliminated.

2. The noise eliminating apparatus according to claim 1, further comprising a condenser for interrupting direct-current signals and low-frequency signals connected between one of said set of system side terminals and one of said set of subscriber side terminals.

3. A noise eliminating apparatus connected between a coaxial cable constituting the system side transmission line of a high-frequency transmission system for transmitting high-frequency signals and a coaxial cable constituting a subscriber side transmission line to eliminate noise entering the coaxial cable from the outside, the noise eliminating apparatus comprising:

an insulating transformer having a primary winding connected to a central conductor and a outer conductor of the coaxial cable for said system side transmission line and a secondary winding connected to the central conductor and the outer conductor of the coaxial cable for said subscriber side transmission line;

a noise eliminating transformer having a pair of windings provided on signal paths, respectively, between both ends of one winding of said insulating transformer and the central conductor and the outer conductor of one of the coaxial cables for the system side transmission and the subscriber side transmission, said noise eliminating transformer eliminating noise components having the same phase and flowing through said signal paths.

4. The noise eliminating apparatus according to claim 3, further comprising a condenser for interrupting direct-current signals and low-frequency signals connected between the outer conductor of the coaxial cable for said system side transmission line and the outer conductor of the coaxial cable for said subscriber side transmission line.

5. A noise eliminating apparatus connected between the system side transmission line of a high-frequency transmission system for transmitting high-frequency signals and a subscriber side transmission line to eliminate noise entering from the outside, the noise eliminating apparatus comprising:

a set of system side terminals connected to said system side transmission line;

a set of subscriber side terminals connected to said subscriber side transmission line;

a first insulating transformer having a primary winding connected to said set of system side terminals and a secondary winding;

a second insulating transformer having a primary winding connected to said set of subscriber side terminals and a secondary winding;

a noise eliminating transformer having a first and a second windings provided between the secondary winding of said first insulating transformer and the secondary winding of said second insulating transformer, wherein one end of the first winding and one end of the second winding are connected to both ends of the secondary winding of said first insulating transformer, and wherein the other end of the first winding and the other end of the second winding are connected to both ends of the secondary winding of said second insulating transformer, and noise components having the same phase and flowing through said first winding and said second winding are eliminated.

6. The noise eliminating apparatus according to claim 5, further comprising a condenser for interrupting direct-current signals and low-frequency signals connected between one of said set of system side terminals and one of said set of subscriber side terminals.

* * * * *